(12) United States Patent
Wilburn et al.

(10) Patent No.: US 6,226,813 B1
(45) Date of Patent: May 8, 2001

(54) ANCHORING SYSTEM FOR A BEACH BLANKET

(76) Inventors: Everett R. Wilburn; Carolyn A. Wilburn, both of 1847 Princeton Dr., Toledo, OH (US) 43614; Anna Josette McLennan, 5913 Douglas Rd., Toledo, OH (US) 43613

( * ) Notice: Subject to any disclaimer, the term of this patent is extended or adjusted under 35 U.S.C. 154(b) by 0 days.

(21) Appl. No.: 09/556,931

(22) Filed: Apr. 21, 2000

Related U.S. Application Data

(60) Provisional application No. 60/130,330, filed on Apr. 21, 1999, and provisional application No. 60/151,239, filed on Aug. 27, 1999.

(51) Int. Cl.[7] .............................. A47G 9/06; E04H 15/12
(52) U.S. Cl. ................................................ 5/417; 135/118
(58) Field of Search ........................ 5/417–420; 135/118

(56) References Cited

U.S. PATENT DOCUMENTS

| | | |
|---|---|---|
| 2,712,864 * | 7/1955 | Clevett, Jr. ............................ 135/118 |
| 2,809,006 | 10/1957 | Jansey . |
| 2,840,092 | 6/1958 | Hill . |
| 2,898,609 * | 8/1959 | Storie ....................................... 5/419 |
| 2,907,057 * | 10/1959 | Specht ...................................... 5/417 |
| 3,237,904 | 3/1966 | Abruzese .................................. 5/417 |
| 4,699,165 | 10/1987 | Barzana .............................. 135/118 |
| 4,927,118 | 5/1990 | Pierorazio ................................. 5/417 |
| 4,953,576 * | 9/1990 | Connelly ............................. 135/118 |
| 5,101,525 | 4/1992 | Ippolito .................................... 5/417 |
| 5,176,354 | 1/1993 | Feigenbaum, Jr. ................... 135/118 |
| 5,245,715 | 9/1993 | Dinkins .................................... 5/417 |
| 5,474,275 | 12/1995 | Robertson et al. .................. 135/118 |
| 5,520,364 * | 5/1996 | Bloxson et al. ......................... 5/417 |
| 5,524,309 | 6/1996 | La Barbera ............................. 5/417 |
| 5,535,461 | 7/1996 | Schwender ............................... 5/420 |
| 5,713,383 | 2/1998 | Ramirez et al. ......................... 5/417 |

* cited by examiner

*Primary Examiner*—Alexander Grosz
(74) *Attorney, Agent, or Firm*—MacMillan, Sobanski & Todd, LLC

(57) ABSTRACT

A system for anchoring an outer periphery of a beach blanket to the ground or sand is disclosed. The blanket is anchored by a plurality of stakes which are manually insertable into the ground. A tether fastens the stake to the outer periphery of the blanket so that the stakes are not separated from the blanket when not in use.

19 Claims, 2 Drawing Sheets

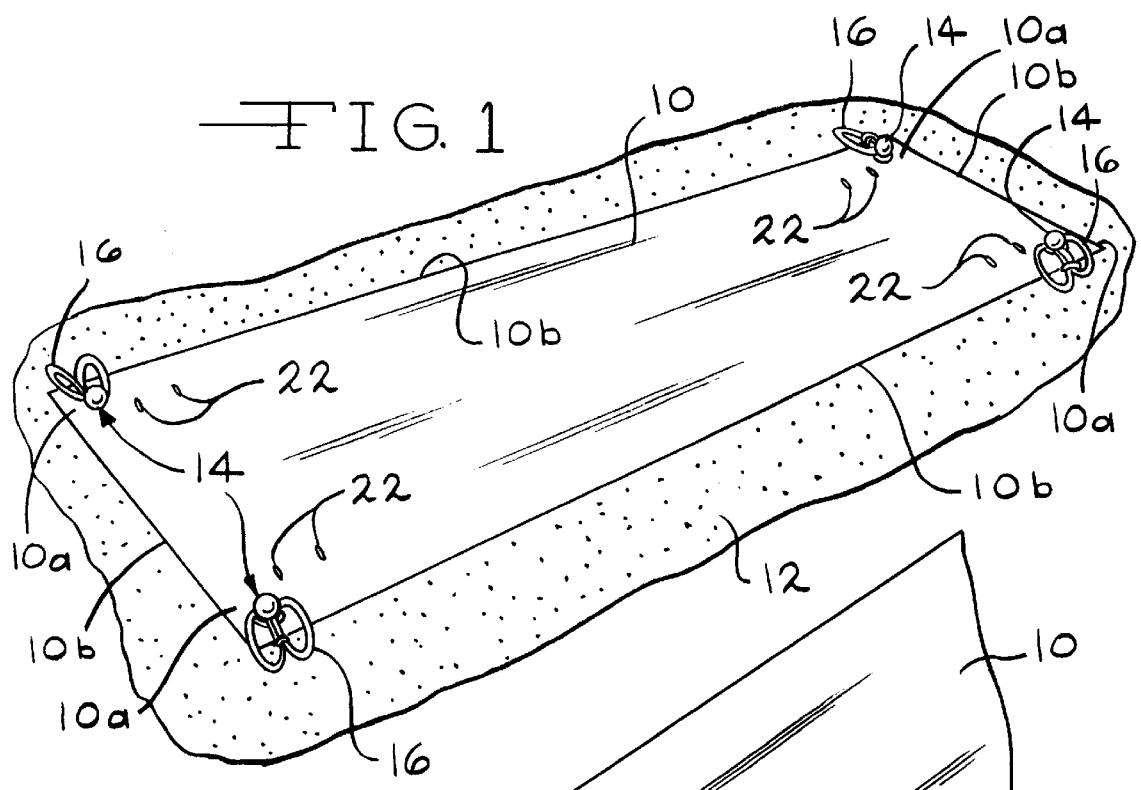
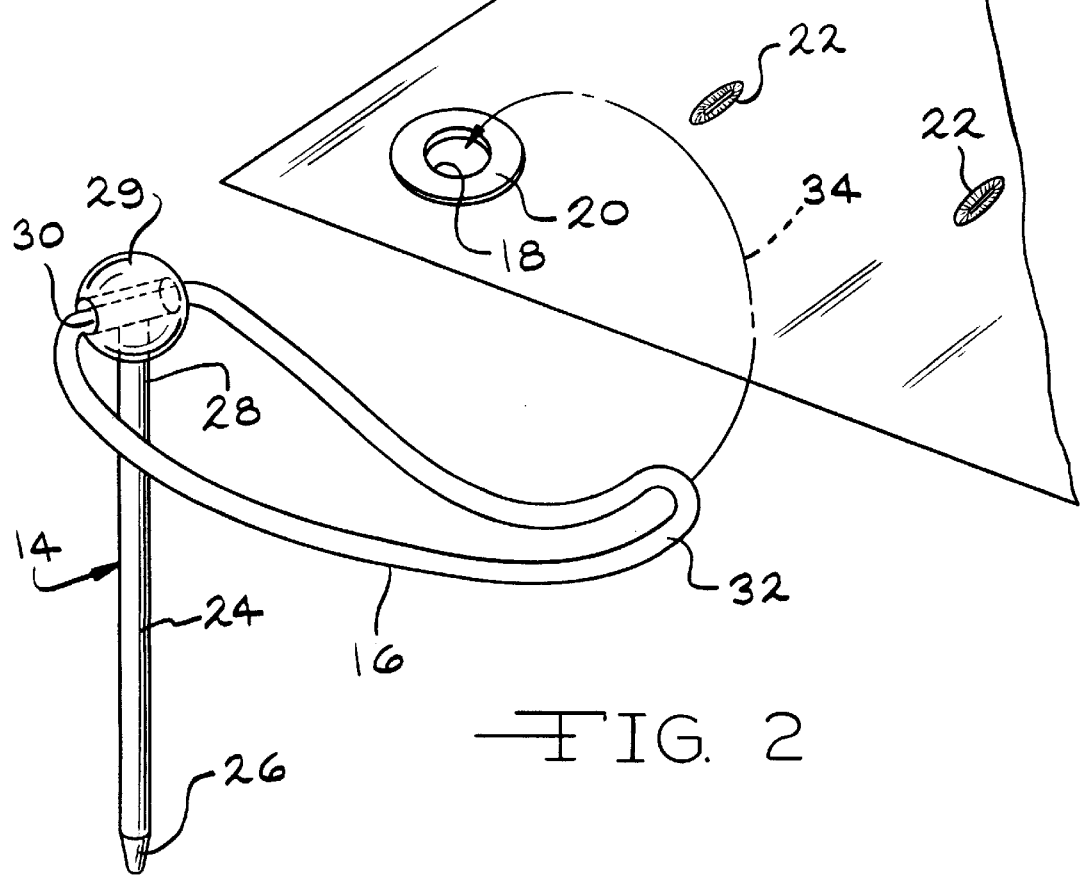

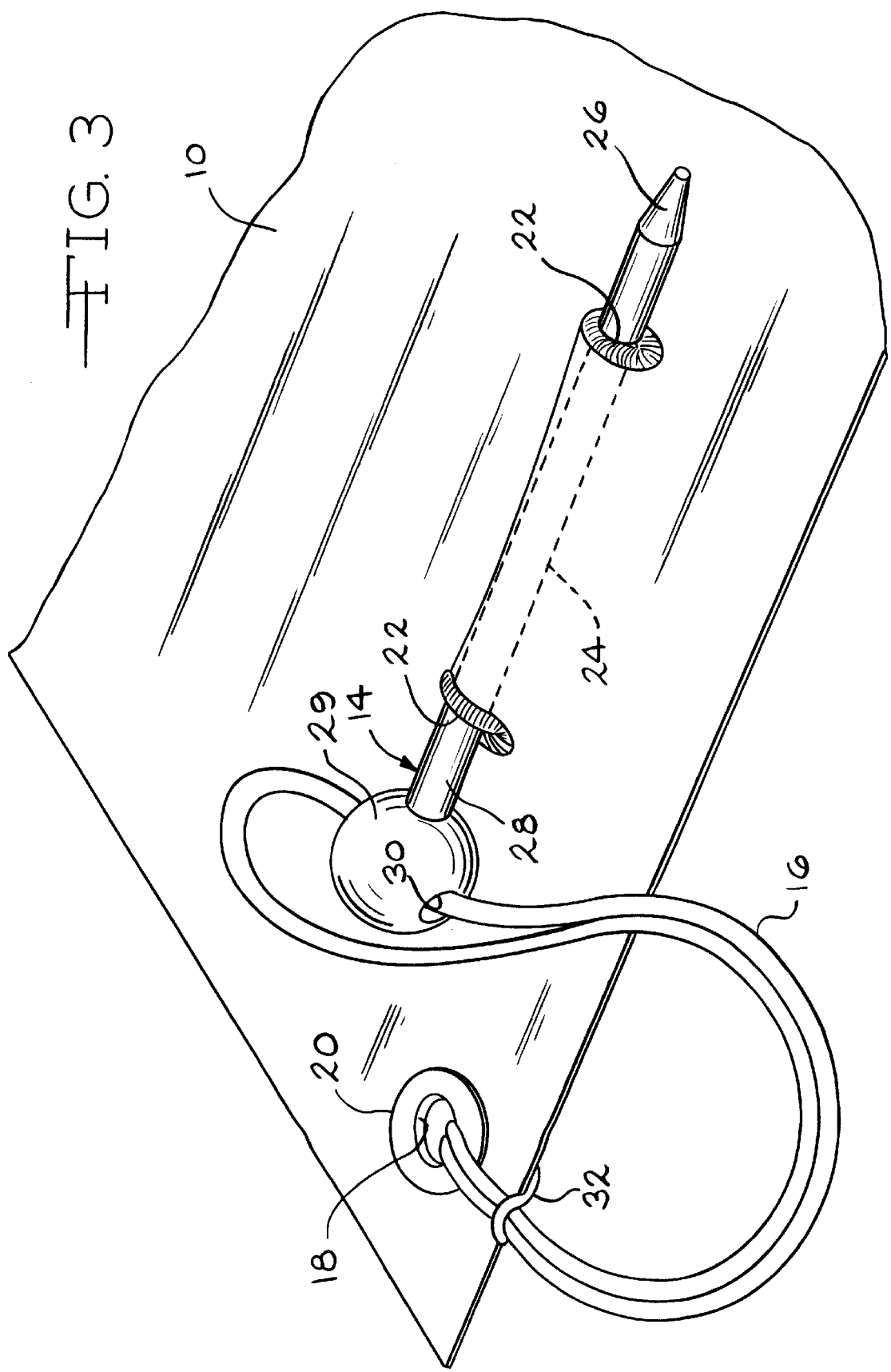

ANCHORING SYSTEM FOR A BEACH BLANKET

CROSS REFERENCE TO RELATED APPLICATIONS

This application claims the benefit of U.S. Provisional Application No. 60/130,330 filed Apr. 21, 1999 and U.S. Provisional Application No. 60/151,239 filed Aug. 27, 1999.

BACKGROUND OF THE INVENTION

This invention relates in general to a system for manually anchoring a beach blanket to the ground or sand.

Commonly, visitors to a park or beach will use a blanket or towel to serve as a ground covering. It is often difficult to maintain the blanket in a stretched out and stationary position flat against the ground due to wind disturbance or occupant movement on top of the blanket. It is therefore desirable to secure or anchor the blanket to the ground to prevent the blanket from moving.

It has been known to anchor the blanket to the ground by means of tie-down pins which are manually inserted into the sand or ground. The upper portions of the tie-down pins have clamps or clips having a pair of opposed hinged jaws. The corners of the blanket are inserted between the jaws, thereby securing the corners of the blanket to the pins. The pins are then inserted into the ground, thereby anchoring the blanket to the ground. Since the corners of the blanket are only held in place by frictional and spring forces of the clips, the corners can be easily pulled out of the jaws. Typically, the clips include multiple interconnecting parts which are relatively costly to produce and assemble. The clips can also be easily broken, for example, by someone stepping on them. A further disadvantage of the use of the tie-down pins is that they can be lost or misplaced relative to the blanket.

BRIEF SUMMARY OF THE INVENTION

This invention relates to an anchorage system for a beach blanket. The blanket defines an outer periphery. A plurality of stakes are fastened to the blanket by a plurality of corresponding tethers attached to the stakes and the blanket. In a preferred embodiment of the invention, the stakes are stowed or retained in slits formed in the blanket when the blanket is not anchored to the ground.

Various objects and advantages of this invention will become apparent to those skilled in the art from the following detailed description of the preferred embodiment, when read in light of the accompanying drawings.

BRIEF DESCRIPTION OF THE DRAWINGS

FIG. 1 is a perspective view of a blanket being anchored to the ground by anchoring stakes in accordance with the present invention.

FIG. 2 is an enlarged perspective view illustrating the tethering of the stake to the corner of the blanket illustrated in FIG. 1.

FIG. 3 is a perspective view of a corner of the blanket of FIG. 1, wherein a stake is inserted into a pair of slits for stowage.

DETAILED DESCRIPTION OF THE INVENTION

Referring now to the drawings, there is illustrated in FIGS. 1 through 3 a blanket 10 which is anchored to sand 12 by a plurality of stakes 14. Although, the blanket 10 is shown and described below as being anchored to the sand 12, it should be understood that the blanket 10 can be anchored to any suitable earthen surface, such as soil, which can receive and retain the manually inserted stakes 14. As discussed in detail below, the stakes 14 are fastened to the blanket 10 by straps or tethers 16. The blanket 10 can be any suitable ground covering, such as a fabric towel or sheet. The blanket 10 can also have any suitable shape or size. For example, the blanket 10 can be a rectangular shaped beach towel generally sized for use by a single person. In the illustrated embodiment of the blanket 10 as shown in FIG. 1, the rectangular shaped blanket 10 is relatively thin and has four corners 10a and four edges 10b. The portions of the blanket 10 adjacent the edges 10b generally define an outer periphery of the blanket 10.

The blanket 10 has a plurality of apertures 18 formed therethrough. Preferably, the rectangular blanket 10 has an aperture located in each corner 10a. As will be discussed in detail below, the apertures 18 receive the stakes 14 for anchoring the corners 10a of the blanket 10 to the sand 12. The apertures 18 can simply be a slit or hole formed through the material of the blanket 10. Preferably, the edges of the material of the blanket 10 adjacent the apertures 18 is reinforced, such as by a relatively rigid plastic or metal grommet 20. The grommet 20 is spool shaped and surrounds the edges of the blanket 10 adjacent the apertures 18. Alternatively, the edges of the apertures 18 can be reinforced by surrounding the edges of the apertures 18 by looped threads to form an eyelet.

The blanket 10 also has a plurality of slits 22 formed therein for snugly securing a stake 14 to the blanket 10 when the blanket 10 is not anchored to the sand 12, as will be explained in detail below. As shown in FIG. 1, the blanket 10 has a pair of slits 22 located generally at each corner 10a of the blanket 10. Of course, any suitable number of slits 22 can be formed in the blanket 10 and can be located anywhere on the blanket 10. Preferably, the edges of the material of the blanket 10 adjacent the slits 22 are reinforced. For example, the slits 22 can be an eyelet formed by looped threads surrounding the opening of the slits 22.

As best shown in FIGS. 2 and 3, the stakes 14 include a generally elongated body 24 having a first end 26 and a second end 28. Preferably, the first end 26 tapers to a blunt point, for ease of insertion of the stake 14 into the sand 12. The second end 28 of the stake 14 includes an enlarged head 29. Preferably, the head 29 is spherical in shape for ease of manual insertion of the stake 14 into the sand 12. Another advantage of a spherically shaped head 29 is the absence of sharp edges or corners. As shown in FIGS. 2 and 3, the elongated body 24 is cylindrical in shape having a generally continuous circular cross-section. The body 24 of the stakes 14 has a diameter which defines a width which is less than the width of the head 29 defined by its diameter. The width of the each aperture 18 is greater than the width of the body 24 but less than the width of the head 29. Thus, when the stakes 14 are anchoring the blanket 10 to the sand 12, as shown in FIG. 1, the head 29 of the stakes 14 prevents the corners 10b from slipping past the head 29.

The stake 14 can have any suitable dimension and can be made of any suitable material, such as wood or plastic. For example, the body 24 can be made from a four to eight inch long cylindrical wooden dowel rod having a 3/8 inch diameter. The head 29 can be made of a one inch diameter wooden ball. The head 29 can be attached to the body 24 by inserting and gluing the second end 28 of the body 24 into an appropriately sized bore formed in the head 29.

Preferably, the heads 29 of each stake 14 includes a hole 30 formed therethrough. The holes 30 of the stakes 14 receive the tethers 16 to fasten the tether 16 to the respective stakes 14. The tethers 16 are also preferably fastened to the blanket 10 by being inserted into respective apertures 18 of the blanket 10. Thus, the stakes 14 are secured to the blanket 10 so that the stakes 14 are not easily misplaced or lost. Although the tethers 14 are shown attached to the blanket 10 by being inserted through the apertures 18, the tethers 14 could be attached to the blanket 10 by other suitable methods, such as by being sewn directly to the material of the blanket 10. The tethers 14 can be any suitable flexible material, such as cloth, twine, cord or rope. Preferably, the tethers 14 are made of cloth twill tape for appearance and long lasting properties.

Preferably, the stakes 14 are removably fastened to the blanket 10 for removing the relatively rigid stakes 14 during laundering of the blanket 10 or to use the blanket 10 for other purposes. One example of a stake 14 being removably fastened to the blanket 10 is illustrated in FIGS. 2 and 3. The tethers 14 are formed into a closed loop while inserted into respective holes 30 of the heads 29 of the stakes 14. For example, the tether 14 could be formed of a single length of will tape which is first inserted through a respective hole 30 of a head 29. The ends of the tape are then sewed together or otherwise fastened together to form a closed loop. Next, a portion 32 of the closed loop of the tether 14 is narrowed or squeezed together and inserted through the aperture 20 of the blanket 10, as represented by a phantom directional line 34 in FIG. 2. The stake 14 is then inserted through the portion 32 extending from the other side of the blanket 10 and pulled therethrough, thereby tightening the tether 14 to form a relatively easily removable tie, as shown in FIG. 3.

To anchor the blanket 10 to the sand 12, the blanket 10 is first stretched out and positioned on top of the sand 12 as desired. Next, the stakes 14 are inserted through respective apertures 18 of the blanket and manually inserted or staked into the sand 12, as shown in FIG. 2. With the stakes 14 securely inserted in the sand 12, the enlarged head 29 prevents corners 10a of the blanket from being raised. Although there is illustrated four stakes 14 in each of the four corners 10a of the blanket 10, any number of stakes 14 can be used. For example, the apertures 18 could be formed through the blanket 10 adjacent the edges 10b of the outer periphery of the blanket 10. Alternatively, the blanket 10 can include additional apertures (not shown) for receiving the stakes 14.

For convenient stowage of the tethered stakes 14 so that the tethered stakes 14 are not loosely tossed about, the blanket 10 preferably includes a pair of slits 22 adjacent each corner 10a of the blanket 10. The pair of slits 22 are spaced apart by a distance which is less than the length of the body 24 of the stake 14. To stow or retain the stakes 14 to the blanket 10, the body 24 is inserted into a first one of the pair of slits 22 on one side of the blanket 10, and then inserted into the other of the slits 22 on the other side of the blanket 10, as shown in FIG. 3. Preferably, the width of the slits 22 is just slightly larger than the width of the body 24 of the stake 14 so that the body 24 fits snugly within the slits 22 for a sufficient frictional hold. Once the stakes 14 are stowed in the slits 22, the blanket 10 can be easily folded.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. In combination:
   1) a beach blanket having an outer periphery, said blanket including an aperture formed therein adjacent said outer periphery;
   2) a stake for anchoring said blanket to ground; and
   3) a tether fastened to said stake and extending through said aperture to fasten said tether to said outer periphery of said blanket.

2. The combination of claim 1, wherein said aperture is sized to receive said stake for anchoring said blanket to the ground.

3. The combination of claim 2, wherein said stake includes an elongated body having first and second ends; said first end of said body adapted to be manually insertable in the ground, said stake further including a head attached to said second end of said body, said head having a width which is larger than the width of said body.

4. The combination of claim 3, wherein said aperture has a width which is less than the width of said head and greater than the width of said body of said stake.

5. The combination of claim 3, wherein said head is substantially spherical.

6. The combination of claim 3, wherein said elongated body has a continuous circular cross-sectional shape.

7. The combination of claim 3, wherein said head includes a hole formed therethrough, said tether extending through said hole to fasten said tether to said stake.

8. The combination of claim 3, wherein said blanket includes a rigid grommet fastened to said outer periphery of said blanket such that said grommet surrounds said aperture.

9. The combination of claim 3, wherein said blanket includes a pair of spaced apart slits formed therein for receiving said body of said stake, said slits having a width which is slightly larger than the width of said body of said stake for snugly securing said stake to said blanket when said blanket is not anchored to the ground.

10. The combination of claim 9, wherein said slits define edges which are surrounded by looped threads to form an eyelet.

11. The combination of claim 3, wherein said first end is tapered to a blunt point.

12. The combination of claim 1, wherein said stake is removably fastened to said blanket.

13. The combination of claim 12, wherein said tether comprises a loop, said loop extending through a hole formed through said stake.

14. The combination of claim 1, wherein the tether is comprised of twill tape.

15. In combination:
   1) a generally rectangular beach blanket having four corners, said blanket having an aperture formed through said blanket at each corner, said blanket having four pairs of slits formed therethrough adjacent said corners of said blanket;
   2) a plurality of stakes for anchoring said corners of said blanket to ground, each of said plurality of stakes including:
      an elongated body having first and second ends, wherein said pairs of slits formed in said blanket are adapted to receive said body of said stakes, said slits having a width which is slightly larger than the width of said body of said stakes for snugly securing said stakes to said blanket when said blanket is not anchored to the ground; and
      a head attached to said first end of said body, said head having a width which is larger than the width of said body; and 3) a tether fastened to said head and said outer periphery of said blanket.

16. In combination:
1) a beach blanket having an outer periphery and an aperture adjacent said outer periphery;
2) a stake for anchoring said blanket to ground; and
3) a tether fastened to said stake and said outer periphery of said blanket, wherein said aperture of said blanket is sized to receive said stake for anchoring said blanket to the ground.

17. The combination of claim 16, wherein said stake includes an elongated body having first and second ends; said first end of said body adapted to be manually insertable in the ground, said stake further including a head attached to said second end of said body, said head having a width which is larger than the width of said body.

18. The combination of claim 17, wherein said aperture has a width which is less than the width of said head and greater than the width of said body of said stake.

19. The combination of claim 16, wherein said tether extends through said aperture to fasten said tether to said outer periphery of said blanket.

* * * * *